United States Patent [19]

Stern

[11] Patent Number: 4,475,090

[45] Date of Patent: Oct. 2, 1984

[54] NOISE GENERATOR HAVING VARIABLE BANDWIDTH AND CENTER FREQUENCY

[75] Inventor: Kurt Stern, Fort Lee, N.J.

[73] Assignee: Micronetics, Inc., Norwood, N.J.

[21] Appl. No.: 410,610

[22] Filed: Aug. 23, 1982

[51] Int. Cl.³ .......................................... H03B 29/00
[52] U.S. Cl. ....................................... 331/78; 331/39
[58] Field of Search ............... 331/78, 39, 43; 328/15, 328/16, 18

[56] References Cited

U.S. PATENT DOCUMENTS 2,960,664 11/1960 Brodwin ............................. 331/78
3,586,993 6/1971 Buck .................................... 331/78

Primary Examiner—Siegfried H. Grimm
Attorney, Agent, or Firm—Charles E. Temko

[57] ABSTRACT

A noise source is coupled through a first bandpass filter to a first mixer to which a first local oscillator signal is applied. The output of the first mixer is coupled through a second bandpass filter to a second mixer to which a second local oscillator signal is applied. At the output of the second mixer is obtained a noise signal having a bandwidth that can be varied by varying the frequency of the first local oscillator, and having a center frequency that can be varied by varying the frequency of the second local oscillator.

2 Claims, 2 Drawing Figures

NOISE GENERATOR HAVING VARIABLE BANDWIDTH AND CENTER FREQUENCY

BACKGROUND OF THE INVENTION

This invention relates generally to the field of random noise generators, and more particularly to an improved form thereof particularly suited for use with relatively sophisticated instrumentation, automatic testing equipment, and electronic warfare. Devices of this general type are known in the art, and the invention lies in specific constructional details which permit an improved mode of operation.

It is known in the art to provide various specialized noise generators for given purposes. The U.S. patent to Cupp, et al, No. 3,311,868, for example, provides circuitry for simulating various noises encountered in the operation of a marine craft. The U.S. Pat. No. 3,942,179 granted to Dorn discloses a filtered noise jammer suitable for radar jamming supplying a modulated noise that has the higher frequencies removed. To the best of my knowledge, no device of this type provides for the selection of a wide range of continuously variable noise bandwidth and center frequency, with separate controls for each function.

SUMMARY OF THE INVENTION

Briefly stated, the invention contemplates the provision of an improved noise generator which provides for the above-mentioned functions, with a first control which adjusts effective bandwidth and a second control which moves the selected bandwidth to the frequency center desired. This is accomplished by providing a pair of mixer elements in series with corresponding bandpass filters, the mixer elements receiving signals from adjustable local oscillators which signals are heterodyned with signals from an original noise source.

BRIEF DESCRIPTION OF THE DRAWINGS

In the drawings, to which reference will be made in the specification.

DETAILED DESCRIPTION OF THE DISCLOSED EMBODIMENT

Before entering into the details of the structural aspects of the invention, a brief review of the theory of operation is considered apposite.

Figure 1:
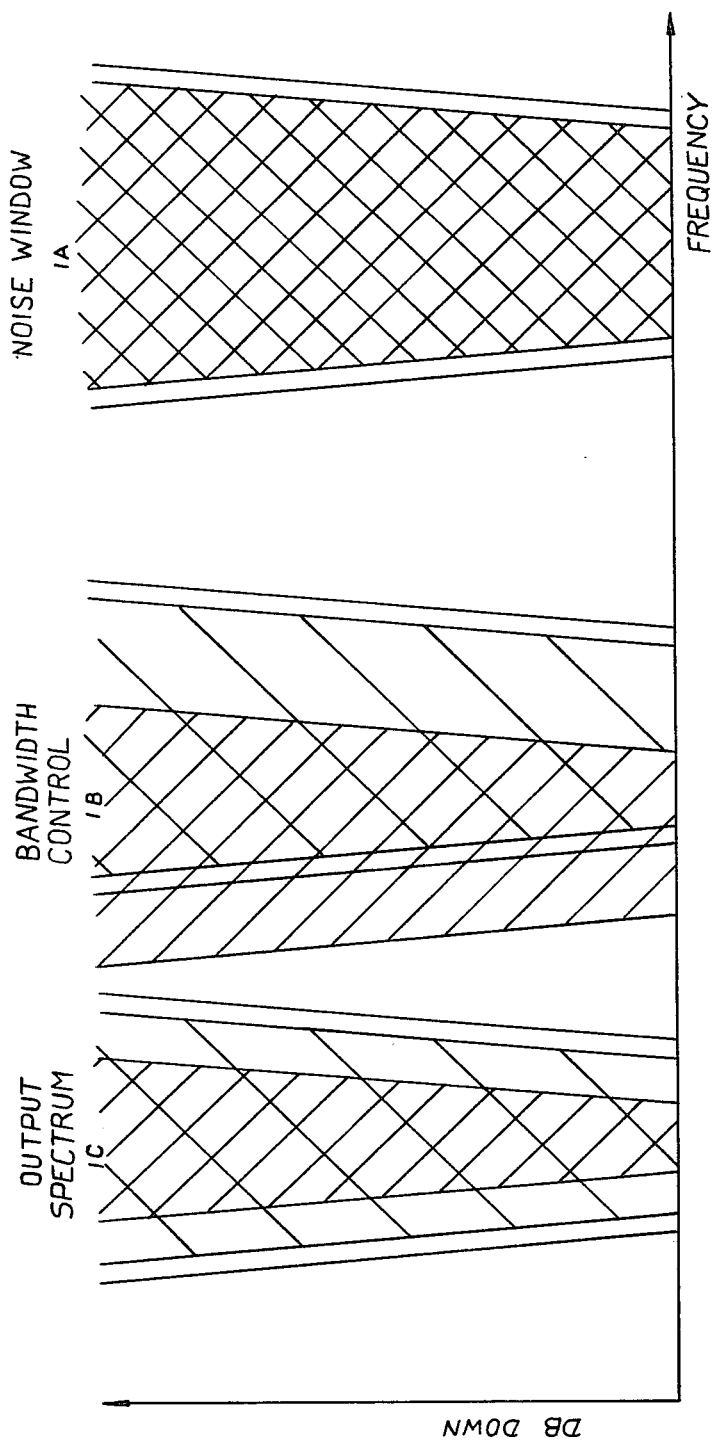
FIG. 1 is a schematic view showing the relative positioning of a noise window with a bandwidth control to vary an output spectrum of noise in accordance with the invention.

A noise source, such as a diode generator generates white noise, the frequency of which extends well beyond the high and low frequency ends of the normally desired total bandwidth of a noise window (see FIG. 1A). The wide band of signal generation is fed through a first bandpass filter to trim the high and low end of the frequency to desired bandwidth. The noise window is then down-converted by means of a first mixer. Bandwidth is varied by adjusting the frequency of a first local oscillator which feeds the first mixer.

Complete alignment of the noise window with a second bandpass filter produces maximum bandwidth. This alignment as shown in FIG. 1B reduces the noise bandwidth. Varying the first local oscillator can then vary bandwidth continuously from maximum to minimum.

Frequency center is then selected by a further down-conversion to the frequency band of interest. This is accomplished by a second mixer fed by a second local oscillator. Varying the frequency of the second local oscillator moves the bandwidth across a third bandpass filter, the third bandpass filter also providing protection against spurious signals outside the desired bandwidth.

Figure 2:
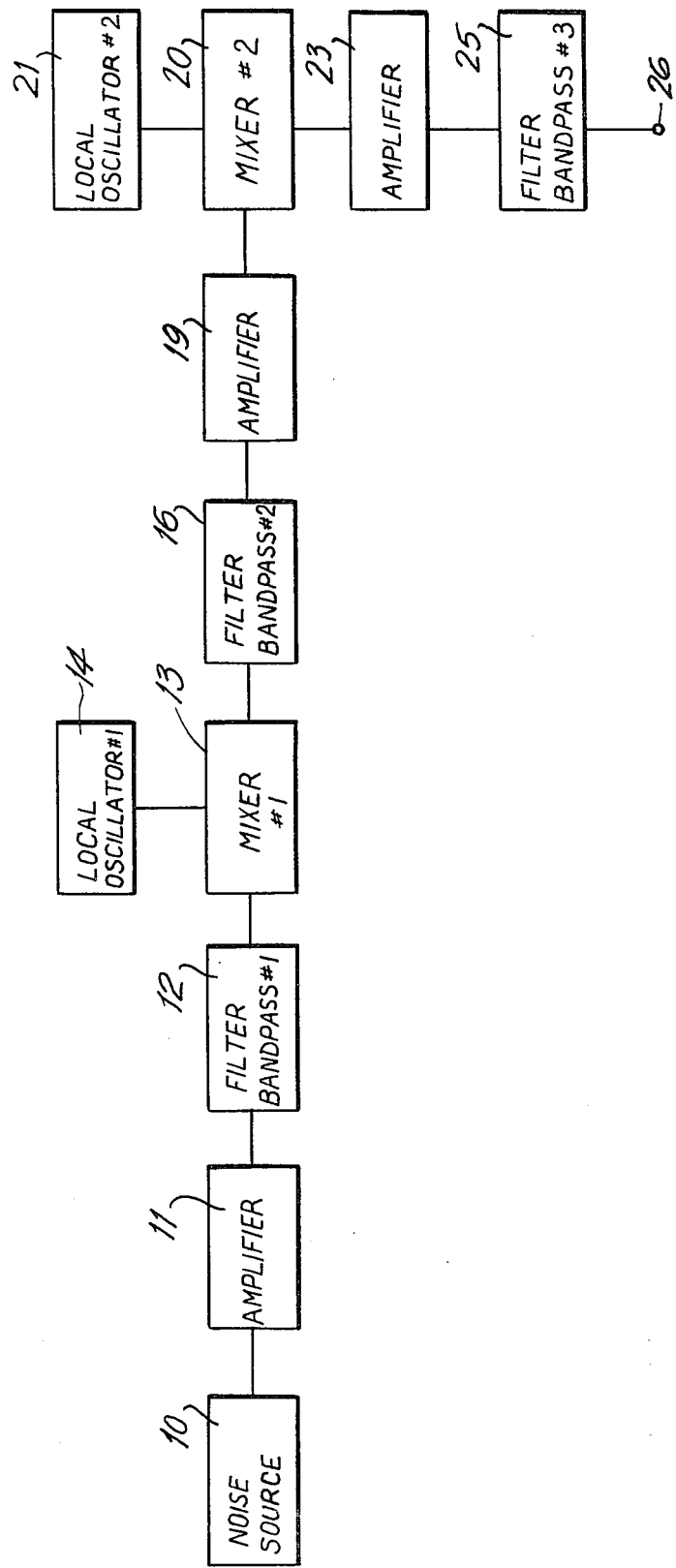
FIG. 2 is a block diagram of an embodiment of the invention.

With the foregoing in mind, reference may now be made to FIG. 2 of the drawing wherein an embodiment of the invention is schematically illustrated.

The device includes a source of white noise 10, which may be a known type of Diode Generator producing a band of white noise in the 775–1000 MHz range. The output is fed to a six stage amplifier 11, and then to a first bandpass filter 12 which forms a noise window. The output of the filter then is passed to a first mixer 13 which also receives the signal of a first local oscillator 14, the first mixer heterodyning the signals to produce an output in the range of 500–725 MHz.

This heterodyned signal is then fed to a second bandpass filter 16 which forms the upper or lower limits of the transmitted band of the heterodyned signal, (the other frequency limit is determined by the first bandpass filter) and then through a three or four stage amplifier 19 before entering a second mixer 20. A second local oscillator 21 provides a signal to be heterodyned in the mixer 20 which then provides a down converted signal in the range of 225–450 MHz. This signal is then amplified in a third amplifier 23, the output of which is fed through a third bandpass filter 25 to a terminal 26 for signal utilization. The third bandpass filter 25 does not appreciably narrow the band, but serves to reject spurious signals outside of the frequency range of interest.

In use, varying the frequency of the first local oscillator, varies the width of the band in terms of frequency which will pass the noise window. Varying the frequency of the second local oscillator serves to shift the center frequency of the transmitted band so that the center thereof is at the frequency of interest.

It will be observed that the local oscillators may be tuned mechanically or electronically without departure from the scope of the invention.

I wish it to be understood that I do not consider the invention limited to the precise details of structure shown and set forth in this specification, for obvious modifications will occur to those skilled in the art to which the invention pertains.

I claim:

1. An improved variable bandwidth noise generator comprising: means for generating a relatively wide band white noise signal; a first bandpass filter receiving said signal, a first local oscillator, a first mixer receiving signals from said first bandpass filter and said first local oscillator, outputting a first heterodyned signal; a second bandpass filter receiving said heterodyned signal, a second local oscillator, and a second mixer receiving the output of said second local oscillator and said second bandpass filter to output a second heterodyned signal; whereby varying the frequency of said first local oscillator serves to vary the bandwidth of the output of said first mixer, and varying the frequency of said second local oscillator determines the center frequency of said bandwidth.

2. A noise generator in accordance with claim 1, further comprising a third bandpass filter receiving the output of said second mixer, and serving to filter spurious signals therefrom.

* * * * *